US006927536B2

(12) United States Patent  
Kim et al.

(10) Patent No.: US 6,927,536 B2
(45) Date of Patent: Aug. 9, 2005

(54) ORGANIC ELECTROLUMINESCENT DISPLAY DEVICE WITH INSULATING LAYER PATTERNS AND METHOD OF FABRICATING THE SAME

(75) Inventors: Ock-Hee Kim, Gyeonggi-do (KR); Kwan-Soo Kim, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/608,574

(22) Filed: Jun. 30, 2003

(65) Prior Publication Data

US 2004/0017151 A1 Jan. 29, 2004

(30) Foreign Application Priority Data

Jul. 25, 2002 (KR) ................................. 10-2002-0043907

(51) Int. Cl.[7] ............................. H01J 1/62; H01J 63/04
(52) U.S. Cl. ...................... 313/504; 313/498; 313/506; 315/169.3
(58) Field of Search ........................... 313/504, 498, 313/500, 506, 512; 257/40, 59; 345/76, 80; 315/169.3

(56) References Cited

U.S. PATENT DOCUMENTS

| 5,276,380 | A |  | 1/1994 | Tang ........................... 313/504 |
| 5,294,869 | A |  | 3/1994 | Tang et al. .................. 313/504 |
| 5,294,870 | A |  | 3/1994 | Tang et al. .................. 313/504 |
| 5,701,055 | A |  | 12/1997 | Nagayama et al. .......... 313/504 |
| 5,742,129 | A |  | 4/1998 | Nagayama et al. .......... 315/167 |
| 5,952,037 | A |  | 9/1999 | Nagayama et al. ............ 427/66 |
| 6,046,547 | A |  | 4/2000 | Nishio et al. ............. 315/169.3 |
| 6,175,345 | B1 |  | 1/2001 | Kuribayashi et al. ......... 345/76 |
| 6,373,455 | B1 |  | 4/2002 | Kuribayashi et al. ......... 345/76 |
| 6,429,584 | B2 | * | 8/2002 | Kubota ........................ 313/504 |
| 2003/0205970 | A1 | * | 11/2003 | Park et al. ................... 313/506 |

FOREIGN PATENT DOCUMENTS

| JP | 2001-117509 | 4/2001 |
| KR | 2000-0038014 | 7/2000 |

* cited by examiner

Primary Examiner—Vip Patel
Assistant Examiner—Kevin Quarterman
(74) Attorney, Agent, or Firm—Morgan, Lewis & Bockius LLP

(57) ABSTRACT

An organic electroluminescent display (ELD) device includes a first substrate having a plurality of pixel regions including a plurality of pixels, a second substrate spaced apart and facing the first substrate, a plurality of switching elements and a plurality of driving elements interconnected on the second substrate, a plurality of connecting electrodes connected to each of the driving elements, a first electrode formed on an inner surface of the first substrate, a plurality of partitions formed on the first electrode, the partitions being formed along boundaries of neighboring pixels, a plurality of organic light-emitting layers disposed on the first electrode, a plurality of second electrodes formed on the organic light-emitting layers, each of the second electrodes are independently formed in each of the pixel regions, are separated by the partitions, and are electrically connected to one of the connecting electrodes, and a plurality of insulating layer patterns formed between the first electrode and the partitions, the insulating layer pattern being formed along the partitions and extending to contact regions of the connecting electrodes and the second electrodes.

18 Claims, 15 Drawing Sheets

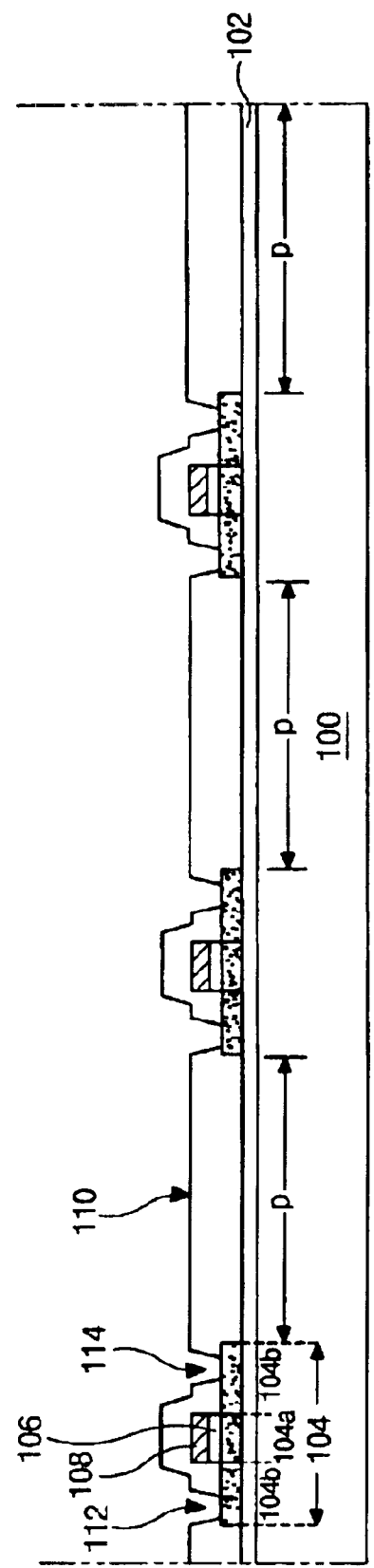

203

ORGANIC ELECTROLUMINESCENT DISPLAY DEVICE WITH INSULATING LAYER PATTERNS AND METHOD OF FABRICATING THE SAME

The present invention claims the benefit of Korean Patent Application No. 2002-43907, filed in Korea on Jul. 25, 2002, which is hereby incorporated by reference.

BACKGROUND OF THE INVENTION

1. Field of the Invention

The present invention relates to a flat panel display device and more particularly, to an electroluminescent display (ELD) device and a method of fabricating an electroluminescent display (ELD) device.

2. Discussion of the Related Art

In general, organic electroluminescent display (OELD) devices have an electron supply electrode, which is commonly referred to as a cathode electrode, and hole supply electrode, which is commonly referred to as an anode electrode. Accordingly, electrons and the holes are input into a light-emitting layer from the cathode and anode electrodes, respectively, wherein the electrons and holes together form exciton pairs and light is emitted when an energy of the exciton is reduced from an excited state to a ground state. Accordingly, since OELD devices do not require additional light sources, both volume and weight of the OELD devices may be reduced, as compared to liquid crystal display (LCD) devices. In addition, the OELD devices are advantageous because of their low power consumption, high luminance, fast response time, and low weight. Currently, OELD devices are implemented in mobile telecommunication terminals, car navigation systems (CNSs), personal digital assistants (PDAs), camcorders, and palm computers. In addition, since manufacturing processes for OELD devices are relatively simple, manufacturing costs can be reduced, as compared to manufacturing costs of LCD devices.

The OELD devices may be classified into passive matrix-type OELD devices and active matrix-type OELD devices. Although the passive matrix-type OELD devices have simple structures and simplified manufacturing processes, they require large amounts of power to operate making them unsuitable for large-sized display devices, and their aperture ratios decrease as the number of electric lines increase. Conversely, the active matrix-type OELD devices have high light-emitting efficiency and high image display quality.

FIG. 1 is a cross sectional view of a passive matrix-type OELD device according to the related art. In FIG. 1, a plurality of pixel regions "P" are defined on a substrate 2, wherein a transparent first electrode 4 is formed on an entire surface of the substrate 2. In addition, a plurality of partitions 16 that have insulating properties are formed along boundary regions of neighboring pixel regions "P" on the substrate 2. A plurality of organic electroluminescent layers 18 corresponding to the pixel regions "P" are formed on the first electrode 4, and a plurality of second electrodes 20 are formed on each of the organic electroluminescent layers 18. Accordingly, the first electrode 4 functions as a hole supply electrode, which supplies holes to each of the organic electroluminescent layers 18, and the second electrodes 20 functions as electron supply electrodes, which supply electrons to each of the organic electroluminescent layers 18.

The partitions 16 protect the organic electroluminescent layers 18 from chemical deterioration during a development and etching processes for forming the second electrodes 20. Accordingly, the second electrodes 20 are formed separately within each of the pixel regions "P" using a shadow masking process. Thus, if the organic electroluminescent layers 18 are formed after formation of the partitions 16, the organic electroluminescent layers 18 are only formed on the first electrode 4 corresponding to the pixel regions "P" and on top surfaces of the partitions 16.

An insulating layer pattern 12, which has a larger area than the top surface of the partitions 16, is formed beneath the partitions 16 to prevent the second electrodes 20 from contacting the first electrode 4 during processes for forming the second electrodes 20. The organic electroluminescent layers 18 may have single-layered structures or multi-layered structures each having a light-emitting layer 18a, an electron carrying layer 18b, and a hole carrying layer 18c.

FIG. 2 is a cross sectional view of an active matrix OELD device according to the related art. In FIG. 2, an OELD device 30 includes a transparent first substrate 32, a thin film transistor array part 34 having a first electrode 36, an organic light-emitting layer 38, and a second electrode 40, wherein the thin film transistor array part 34 is formed directly on the transparent first substrate 32, and the first electrode 36, organic light-emitting layer 38, and second electrode 40 are formed over the thin film transistor array part 34. The light-emitting layer 38 displays red (R), green (G), and blue (B) colors and is formed by patterning organic material(s) separately for each pixel for the R (red), G (green) and B (blue) colors. The organic electroluminescent display (ELD) device 30 is completed by bonding the first substrate 32 and a second substrate 48 together by disposing a sealant material 47 between the first and second substrates 32 and 48.

In FIG. 2, the second substrate 48 has a moisture absorbent desiccant 41 for removing moisture and oxygen that may infiltrate into an interior of the OELD device 30. The moisture absorbent desiccant 41 is formed by etching away a portion of the second substrate 48, filling the etched portion of the second substrate 48 with moisture absorbent desiccant material, and fixing the moisture absorbent desiccant material with tape 45.

FIG. 3 is a plan view of a thin film transistor array pixel part of an OELD device according to the related art. In FIG. 3, a pixel includes a switching element $T_S$, a driving element $T_D$, and a storage capacitor $C_{ST}$ at every pixel region "P" defined on a substrate 32, wherein the switching element $T_S$ and the driving element $T_D$ are formed with combinations of more than two thin film transistors (TFTs), and the substrate 32 is formed of a transparent material, such as glass and plastic. A gate line 42 is formed along a first direction, and a data line 44 is formed along a second direction perpendicular to the first direction, wherein the data line 44 perpendicularly crosses the gate line 42 with an insulating layer between the gate and data lines 42 and 44 and a power line 55 is formed along the second direction, and is spaced apart from the data line 44.

The thin film transistor used for the switching TFT $T_S$ has a gate electrode 46, an active layer 50, a source electrode 56, and a drain electrode 60, and the thin film transistor for the driving TFT $T_D$ has a gate electrode 68, an active layer 62, a source electrode 66, and a drain electrode 63. The gate electrode 46 of the switching TFT $T_S$ is electrically connected to the gate line 42, and the source electrode 56 of the switching TFT $T_S$ is electrically connected to the data line 44. In addition, the drain electrode 60 of the switching TFT $T_S$ is electrically connected to the gate electrode 68 of the driving TFT $T_D$ through a contact hole 64, and the source electrode 66 of the driving TFT $T_D$ is electrically connected to the power line 55 through a contact hole 58. Furthermore, the drain electrode 63 of the driving TFT $T_D$ is electrically connected to a first electrode 36 within the pixel region "P," wherein the power line 55 and a first capacitor electrode 35 that is formed of polycrystalline silicon layer form a storage capacitor $C_{ST}$.

FIG. 4 is a cross sectional view along IV—IV of FIG. 3 according to the related art. In FIG. 4, the OELD device includes the driving TFT $T_D$, a first electrode 36, a light-emitting layer 38, and a second electrode 80, wherein the driving TET $T_D$ has a gate electrode 68, an active layer 62, a source electrode 66, and a drain electrode 63. Accordingly, the first electrode 36 is formed over the driving TFT $T_D$ and is connected to the drain electrode 63 of the driving TFT $T_D$ with an insulating layer 67 between the first electrode 36 and the driving TFT $T_D$. The light-emitting layer 38 is formed on the first electrode 36 for emitting light of a particular color wavelength within an emission region E, and the second electrode 80 is formed on the light-emitting layer 38. A storage capacitor $C_{ST}$ (in FIG. 3) is connected in parallel to the driving TFT $T_D$, and includes first and second capacitor electrodes 35 and 55. The source electrode 66 of the driving TFT $T_D$ contacts the second capacitor electrode 55, i.e., a power line, and the first capacitor electrode 35 is formed of polycrystalline silicon material under the second capacitor electrode 55. The second electrode 80 is formed on the substrate 32 on which the driving TFT $T_D$, the storage capacitor $C_{ST}$, and the organic light-emitting layer 38 are formed. Accordingly, the OELD device is a bottom emission-type OELD device, wherein the light-emitting layer emits the light downward through the substrate 32. In addition, each of the pixels having the driving TFT $T_D$ and the storage capacitor $C_{ST}$ are separated by partitions formed between two adjacent pixels.

FIG. 5 is a cross sectional view along V—V of FIG. 3 according to the related art. In FIG. 5, a switching TFT $T_s$, a first electrode 76, an organic light-emitting layer 38, and a second electrode 80 are formed on the substrate 32. The switching TFT $T_s$ has an active layer 50 formed of poly-crystalline silicon, a gate electrode 46 on the active layer 50, a source electrode 56 and a drain electrode 60, wherein the first electrode 76, the organic light-emitting layer 38, and the second electrode 80 are sequentially formed over the switching TFT $T_s$. The organic light-emitting layer 38 is formed to have a multi-layered structure including a main light-emitting layer 38a, an electron-carrying layer 38b, and a hole-carrying layer 38c. Partitions 70 are formed within a boundary region of each pixel to insulate adjacent pixels and to maintain a necessary gap for supplying a shadow mask during processing. The partitions 70 have a trapezoidal shape, wherein a width gradually decreases from a bottom to a top of the partitions 70 to form the second electrode 80 on an entire surface of the substrate 32 and along the top surfaces of the partitions 70.

However, the passive-type OELD devices are not adequate for large-sized electroluminescent display devices. Conversely, although the active matrix-type OELD devices are suitable for large-sized electroluminescent display devices, the thin film transistor array part and the light-emitting part are formed on a same substrate. For example, active matrix-type OELD devices are commonly manufactured by forming the thin film transistor array part and the light-emitting part on a same substrate, and then bonding the substrate to an encapsulating structure. Accordingly, a panel yield having the thin film transistor array part and the light-emitting part is dependent upon the product of the individual yields of the thin film transistor array part and the light-emitting part. However, the panel yield is greatly affected by the yield of the organic light-emitting layer. Thus, if an inferior organic light-emitting layer that is usually formed of a thin film having a thickness of 1000 Å is defective due to impurities and/or contaminants, the panel is rejected as being an inferior quality panel, wherein production and material costs are lost and panel yield decreases.

Although bottom emission-type OELD devices have high image stability and variable fabrication processing, they are not adequate for implementation in devices that require high image resolution due to their increased aperture ratio. In addition, since top emission-type OELD devices emit light along an upward direction through the substrate, the light is not influenced by the thin film transistor array part that is positioned under the light-emitting layer. Accordingly, design of the thin film transistors may be simplified and the aperture ratio can be increased, thereby increasing the operational life span of the device. However, since a cathode is formed over the light-emitting layer in OELD devices, material selection and light transmittance are limited, whereby light transmission efficiency is reduced. In addition, if a thin film-type passivation layer is formed to prevent the reduction of the light transmittance, the thin film passivation layer may fail to prevent infiltration of ambient air into the device.

SUMMARY OF THE INVENTION

Accordingly, the present invention is directed to an organic electroluminescent display (OELD) device and a method of fabricating an OELD device that substantially obviates one or more of the problems due to limitations and disadvantages of the related art.

An object of the present invention is to provide an organic electroluminescent display (OELD) device having partitions for preventing damage to electrodes of the OELD device.

Another advantage of the present invention is to provide a method of fabricating an organic electroluminescent display (OELD) device having partitions for preventing damage to electrodes of the OELD device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display (ELD) device includes a first substrate having a plurality of pixel regions including a plurality of pixels, a second substrate spaced apart and facing the first substrate, a plurality of switching elements and a plurality of driving elements interconnected on the second substrate, a plurality of connecting electrodes connected to each of the driving elements, a first electrode formed on an inner surface of the first substrate, a plurality of partitions formed on the first electrode, the partitions being formed along boundaries of neighboring pixels, a plurality of organic light-emitting layers disposed on the first electrode, a plurality of second electrodes formed on the organic light-emitting layers, each of the second electrodes are independently formed in each of the pixel regions, are separated by the partitions, and are electrically connected to one of the connecting electrodes, and a plurality of insulating layer patterns formed between the first electrode and the partitions, the insulating layer pattern being formed along the partitions and extending to contact regions of the connecting electrodes and the second electrodes.

In another aspect, a method of fabricating an organic electroluminescent display (ELD) device includes steps of forming a plurality of switching elements and a plurality of driving elements interconnected on a first substrate having a plurality of pixels, forming a plurality of connecting electrodes interconnected to each of the driving elements, forming a first electrode on an inner surface of the second substrate, forming a plurality of partitions over the first electrode, the partitions being formed along boundaries of neighboring pixels, forming organic light-emitting layers on the first electrode, forming second electrodes on the organic light-emitting layer, forming an insulating layer pattern between the first electrode and the partitions, the insulating layer pattern being formed along the partitions to extend to contact regions of the connecting electrodes and the second electrodes, and bonding the first and second substrates together, wherein the connecting electrodes of the first substrate contacts the second electrodes of the second substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 7A to 7C are cross sectional views of an exemplary method of fabricating a TFT array part of an OELD device according to the present invention;

DETAILED DESCRIPTION OF THE PREFERRED EMBODIMENTS

Reference will now be made in detail to the illustrated embodiment of the present invention, which is illustrated in the accompanying drawings.

Figure 1:
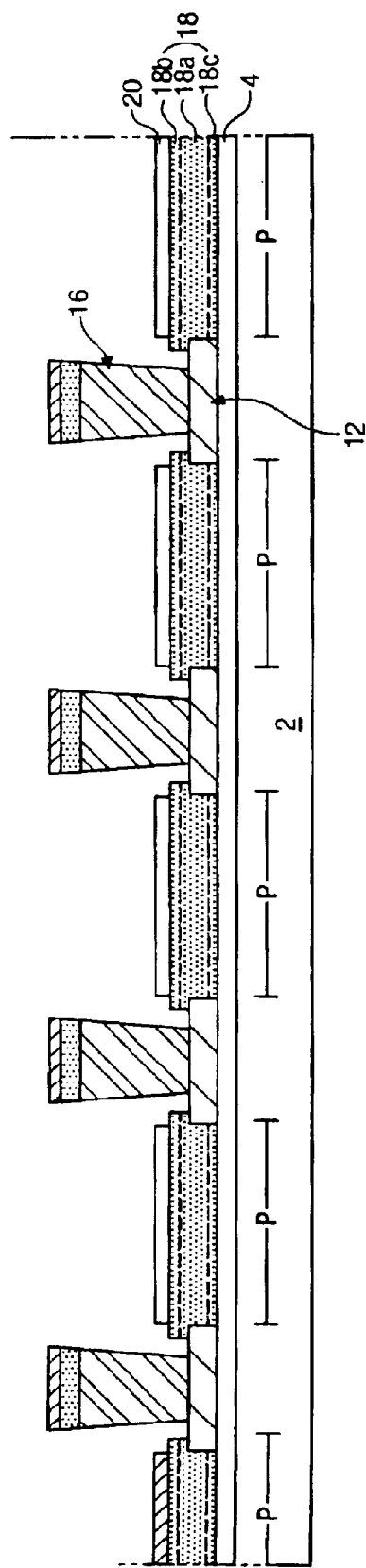
FIG. 1 is a cross sectional view of a passive matrix-type OELD device according to the related art.
Figure 2:
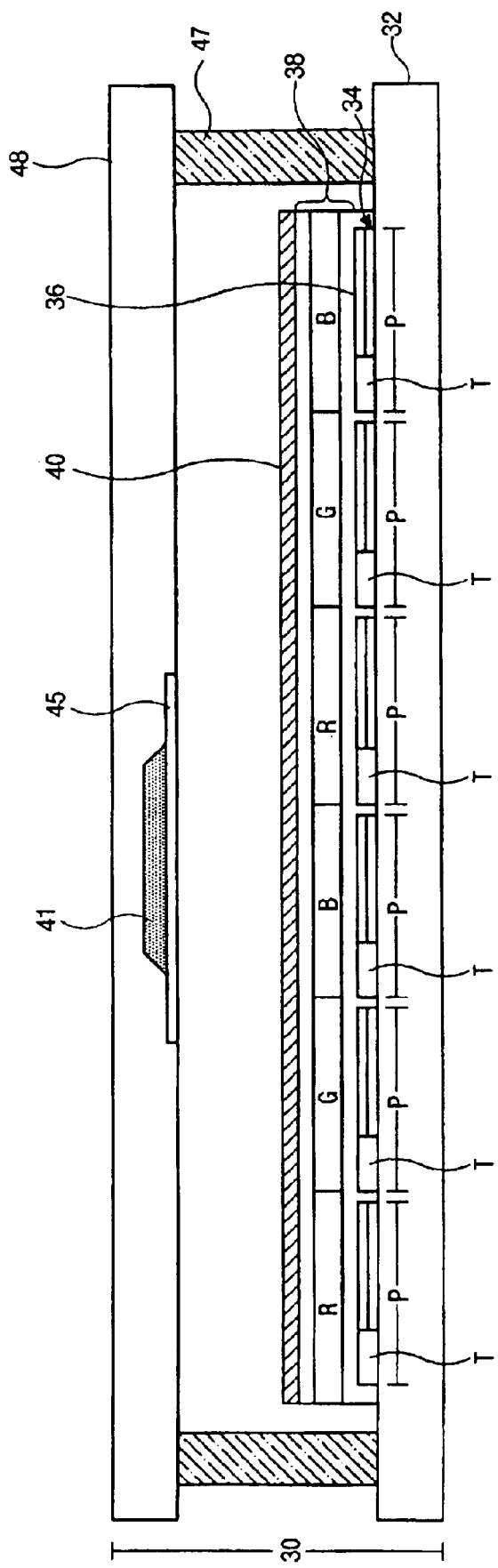
FIG. 2 is a cross sectional view of an active matrix OELD device according to the related art.
Figure 3:
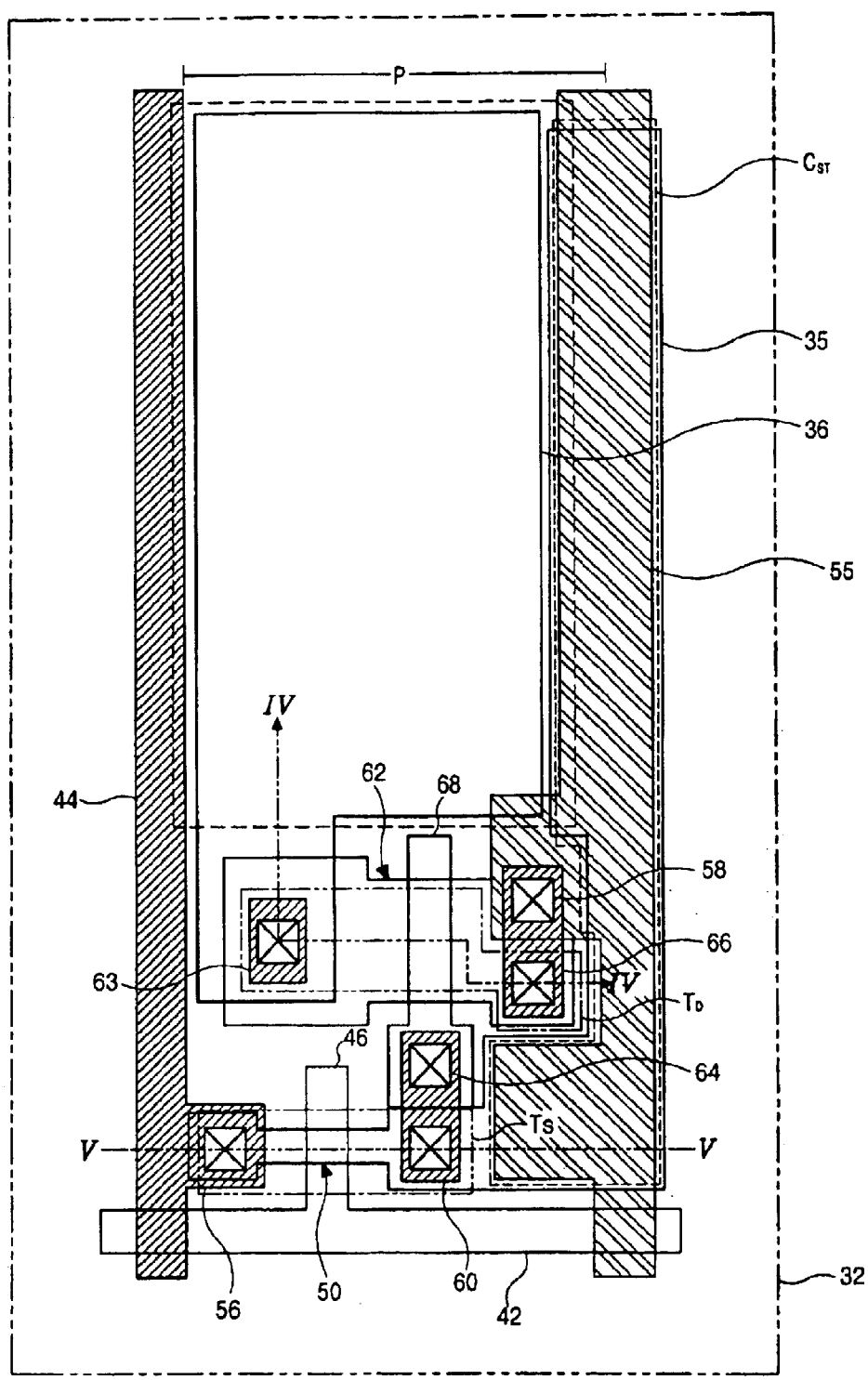
FIG. 3 is a plan view of a thin film transistor array pixel part of an OELD device according to the related art.
Figure 4:
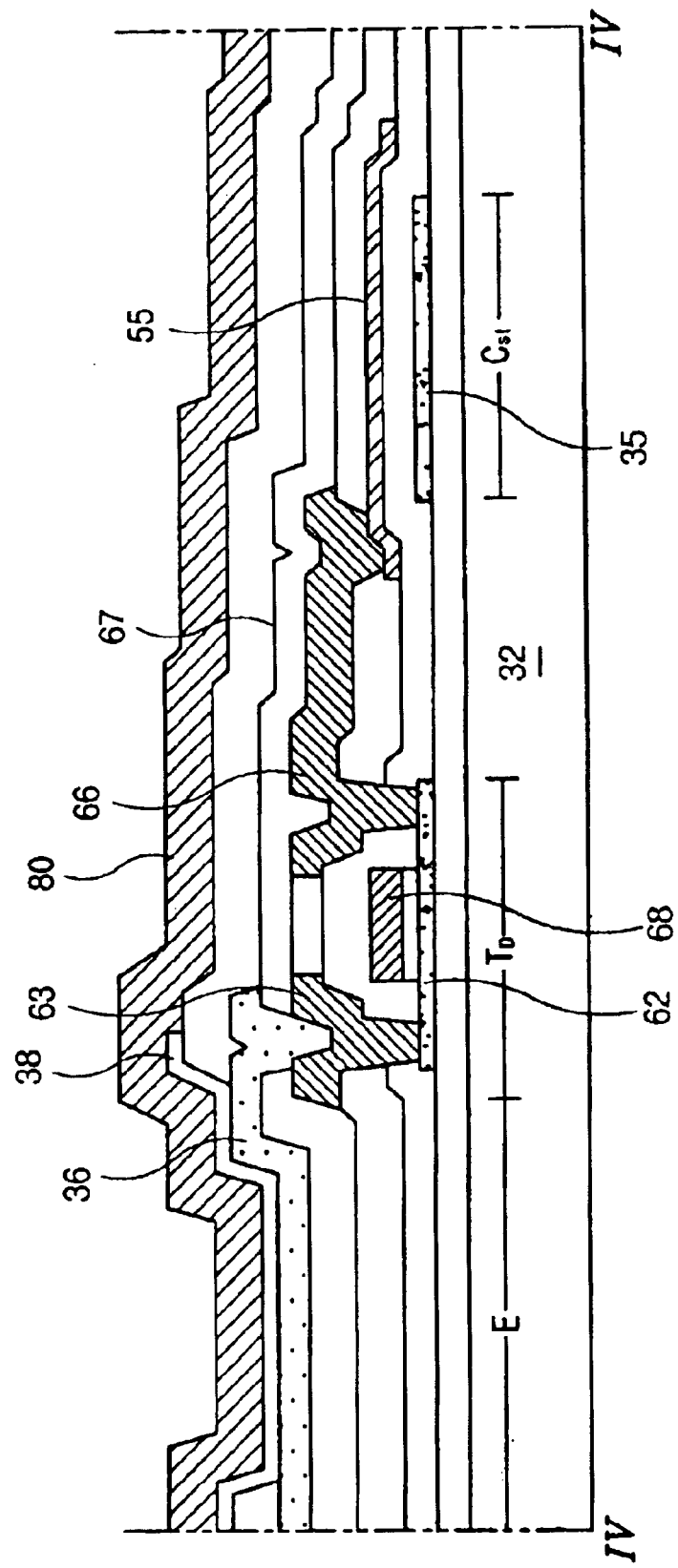
FIG. 4 is a cross sectional view along IV—IV of FIG. 3 according to the related art.
Figure 5:
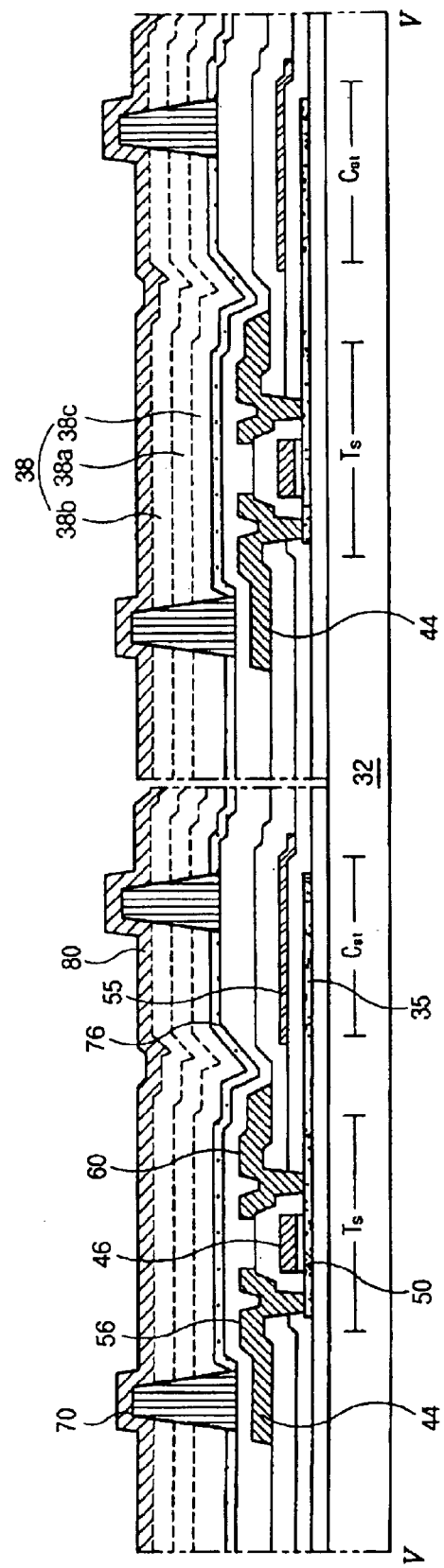
FIG. 5 is a cross sectional view along V—V of FIG. 3 according to the related art.
Figure 6:
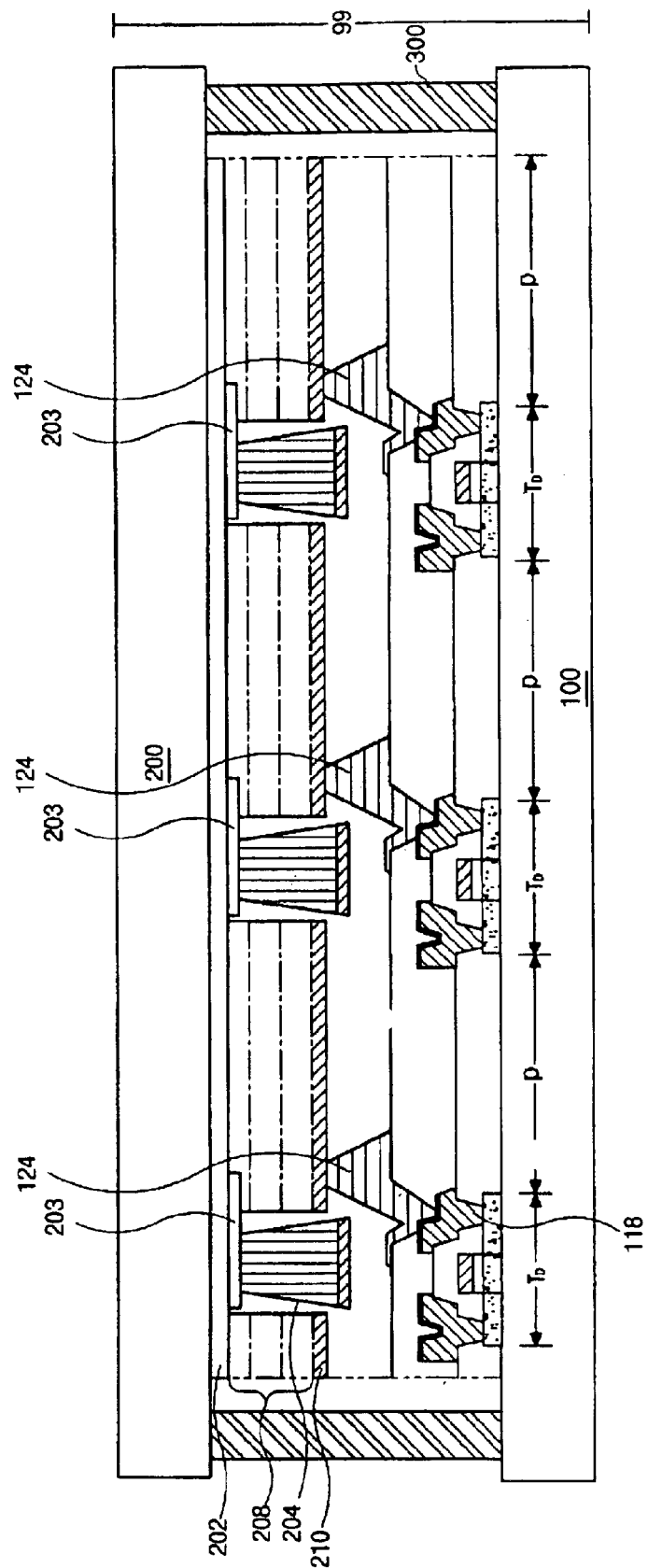
FIG. 6 is a cross sectional view of an exemplary OELD device according to the present invention.

FIG. 6 is a cross sectional view of an exemplary OELD device according to the present invention. In FIG. 6, an organic electroluminescent display (OELD) device 99 may be fabricated by attaching transparent first and second substrates 100 and 200 together with a sealant material 300 disposed between the first and second substrates 100 and 200. Accordingly, a plurality of pixel regions "P" may be defined on the first and second substrates 100 and 200, wherein a switching TFT "$T_s$" (not shown), a driving TFT "$T_D$," and a plurality of array lines (not shown) may be provided corresponding to each of the pixel regions "P."

A first electrode 202 functioning as a hole supply electrode may be formed on an entire surface of the second substrate 200, and a plurality of organic light-emitting layers 208 and a plurality of second electrodes 210 may be sequentially formed on the first electrode 202. Accordingly, the second electrodes 210 may be individually formed within each pixel region "P" and may be separated by partitions 204 that may be formed in positions corresponding to the driving TFT "$T_D$," wherein the partitions may have a lattice shape.

The second electrodes 210 may be electrically connected to each drain electrode 118 of the driving TFT "$T_D$" via additional connecting electrodes 124. For example, the connecting electrodes 124 may be formed on the first substrate 100 and may contact each of the second electrodes 210 formed on the organic light-emitting layer 208 by attaching the first and second substrates 100 and 200 together. The connecting electrodes 124 may be formed of a same material as the second electrodes 210, or may be formed of different materials. In addition, an insulating layer pattern 203 may be formed between the first electrode 202 and the partitions 204 and may extend to a portion of the first electrode 202 corresponding to contact points of the second electrodes 210 and the connecting electrodes 124. Accordingly, the insulating layer pattern 203 may prevent the first and second electrodes 202 and 210 from becoming detached when pressure is exerted by the connecting electrodes 124 against the second electrodes 210.

Figure 7B:
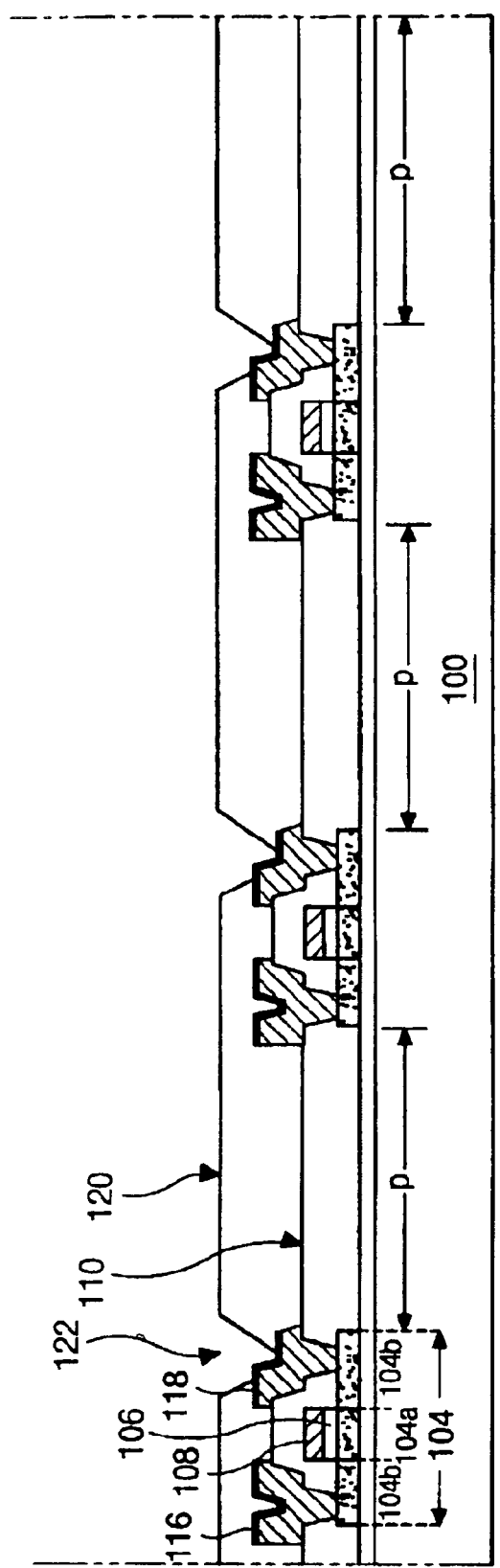
Figure 7C:
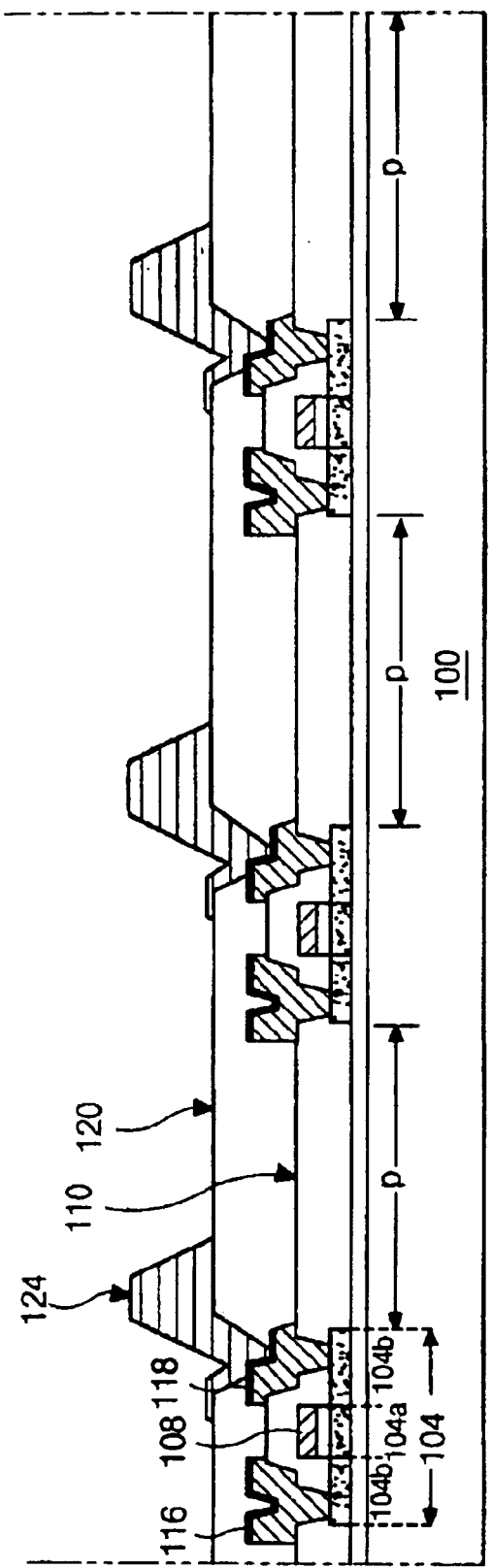

FIGS. 7A to 7C are cross sectional views of an exemplary method of fabricating a TFT array part of an OELD device according to the present invention. In FIG. 7A, a buffer layer 102 may be formed by depositing at least one of inorganic insulating material(s), such as silicon nitride (SiNx) and silicon oxide ($SiO_2$), upon an entire surface of a substrate 100 having a plurality of pixel regions defined thereon. Then, an active layer 104 may be formed by depositing amorphous silicon (a-Si:H) on the buffer layer 102, dehydrogenating the deposited amorphous silicon (a-Si:H), crystallizing dehydrogenated silicon into polycrystalline silicon layer, and patterning the polycrystalline silicon layer, wherein the active layer 104 may include first and second active layers 104a and 104b.

Next, a gate insulating layer 106 may be formed by depositing inorganic insulating material(s), such as silicon nitride (SiNx) and silicon oxide ($SiO_2$), onto an entire surface of the substrate 100. Then, a gate electrode 108 may be formed on the gate insulating layer 106 at positions corresponding to the first active layer 104a, wherein portions of the gate insulating layer 106 that may have remained on the substrate 100 may have been etched to have a same pattern shape as the gate electrode 108.

The second active layer 104b may be converted into an ohmic contact layer by doping the second active layer 104b with impurities, such as boron group elements or phosphorus group elements. Then, an interlayer 110 may be formed on an entire surface of the substrate 100 upon which the gate electrode 108 may have been formed, wherein first and second contact holes 112 and 114 that expose portions of the second active layer 104b may be formed by patterning the interlayer 110. The gate electrode 108 may include conductive metal material(s), such as aluminum (Al), aluminum alloys, copper (Cu), tungsten (W), tantalum (Ta), and molybdenum (Mo), and the interlayer 110 may include inorganic insulating materials, such as silicon nitride (SiNx) and silicon oxide ($SiO_2$).

In FIG. 7B, source and drain electrodes 116 and 118 may be formed to electrically contact the exposed portions of the second active layer 104b by depositing a second metal layer on the interlayer 110, and patterning the second metal layer. Then, a passivation layer 120 may be formed by depositing or coating inorganic insulating material(s), such as silicon nitride (SiNx) and silicon oxide ($SiO_2$), or organic insulating material(s), such as benzocyclobutene (BCB) and an acrylic resin, on an entire surface of the substrate 100. Next, a drain contact hole 122 may be formed to expose a portion of the drain electrode 118 by patterning the passivation layer 120.

In FIG. 7C, a connecting electrode 124 that electrically contacts the drain electrode 118 may be formed by depositing conductive metal material(s) on the passivation layer 120, and patterning the conductive material(s). Although not shown, a switching TFT that is connected to the driving TFT "$T_D$" (in FIG. 6) may be formed using similar processes as the process for forming the driving TFT "$T_D$." Accordingly, a drain electrode of the switching TFT may be electrically connected to the gate electrode 108 of the driving TFT "$T_D$." In addition, a gate line (not shown) may be simultaneously formed during formation of the gate electrode of the switching TFT, and a data line (not shown) may be simultaneously formed with formation of the source and drain electrodes of the switching TFT.

Accordingly, in the OELD device, if P-type TFTs are used for the switching and driving TSTs, the second electrodes 210 may function as cathode electrodes (in FIG. 6). Conversely, if N-type TSTs are used for the switching and driving TSTs, the second electrodes 210 may function as anode electrodes. Accordingly, polarity of the first and second electrodes 202 and 210 may be changed depending on the types of TSTs being implemented.

Figure 8A:
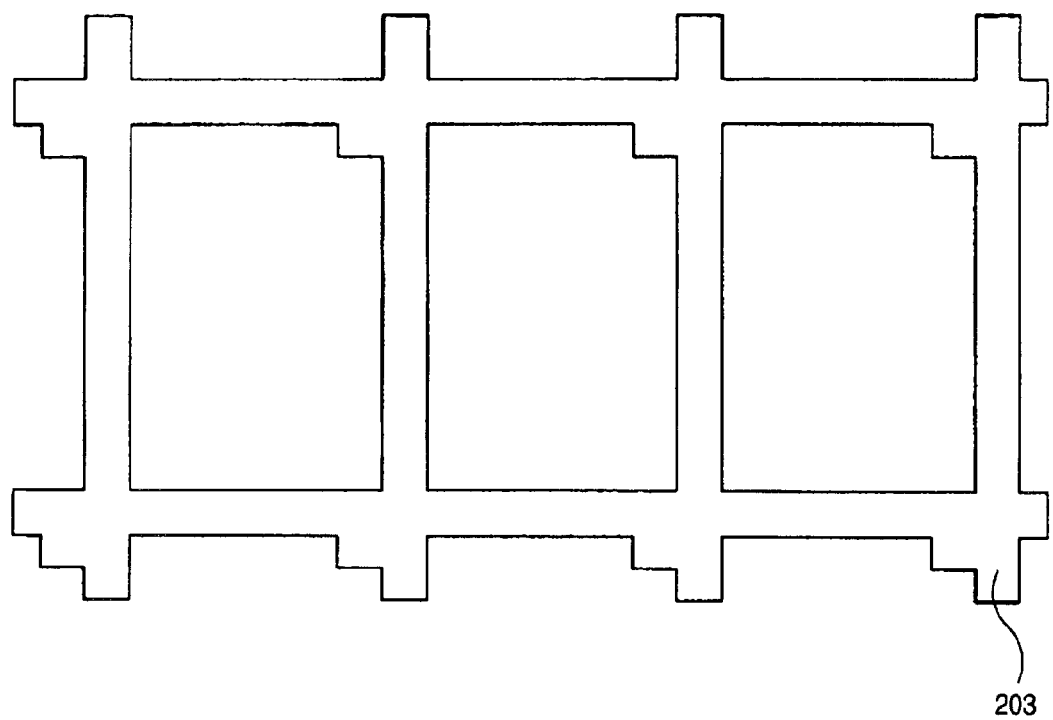
FIGS. 8A and 8B are plan views of exemplary pixels of an OELD device according to the present invention.
Figure 8B:
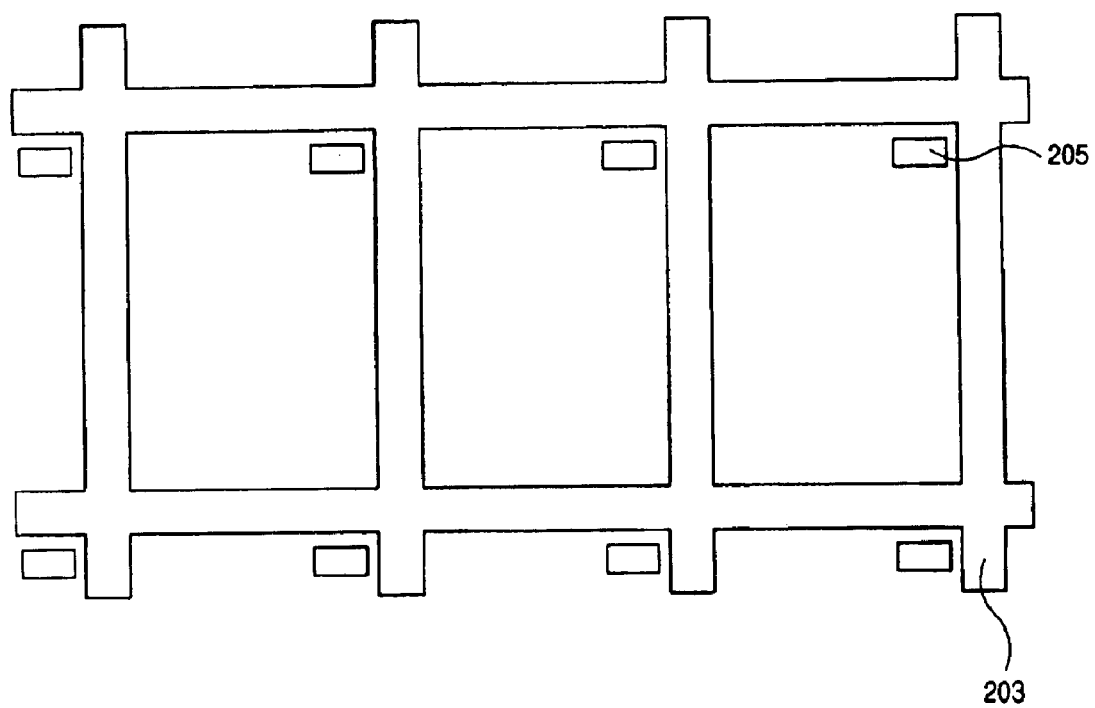

FIGS. 8A and 8B are plan views of exemplary pixels of an OELD device according to the present invention. In FIG. 8A, an insulating layer pattern 203 may be formed in a lattice pattern configuration and may be formed to extend from the lattice pattern to a contact portions of the second electrodes 210 and the connecting electrodes 124.

In FIG. 8B, separate insulating layer patterns 205 may be formed corresponding to contact portions of the second electrodes 210 and the connecting electrodes 124.

Figure 9:
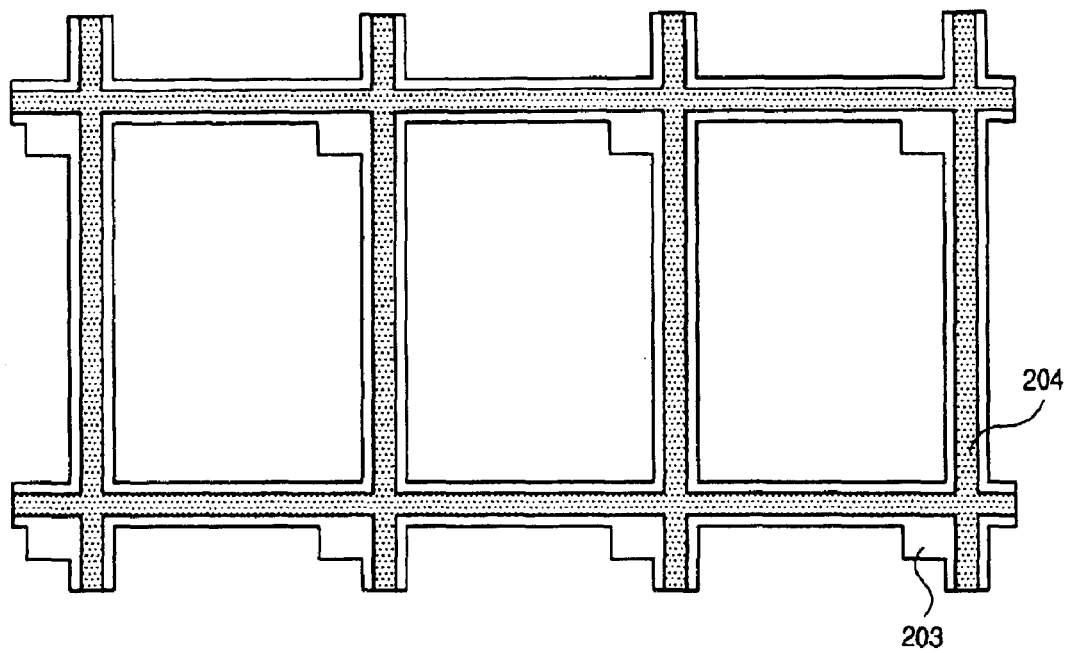
FIG. 9 is a plan view of exemplary pixels of an OELD device according to the present invention.

FIG. 9 is a plan view of exemplary pixels of an OELD device according to the present invention. In FIG. 9, a partition 204 having a lattice pattern configuration may be formed on an insulating layer pattern 203, wherein vertical and horizontal portions of the partition 204 may correspond to vertical and horizontal portions o fhte insulating layer pattern 203.

Figure 10A:
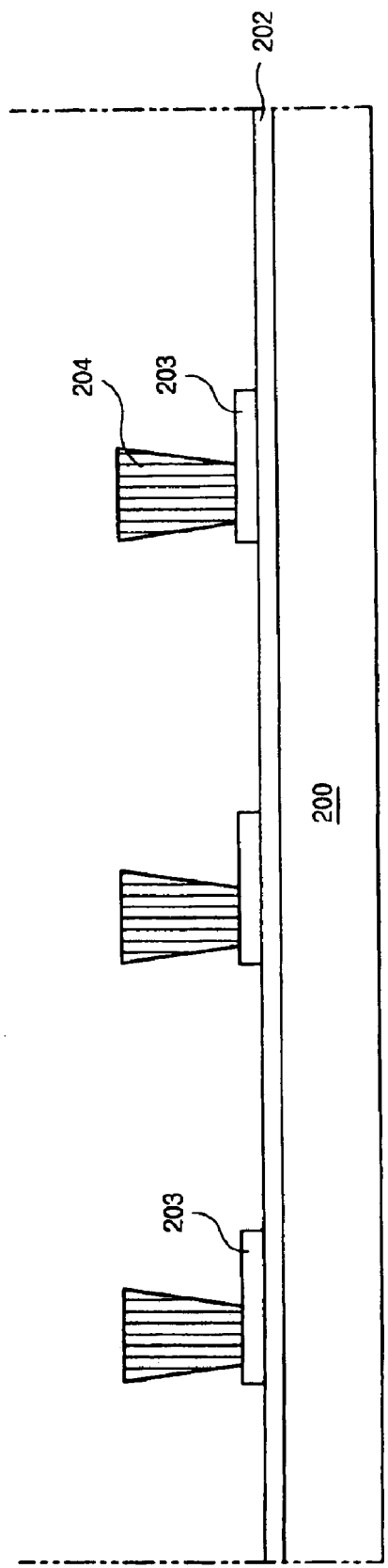
FIGS. 10A to 10C are cross sectional views of another exemplary method of fabricating an OELD device according to the present invention.
Figure 10B:
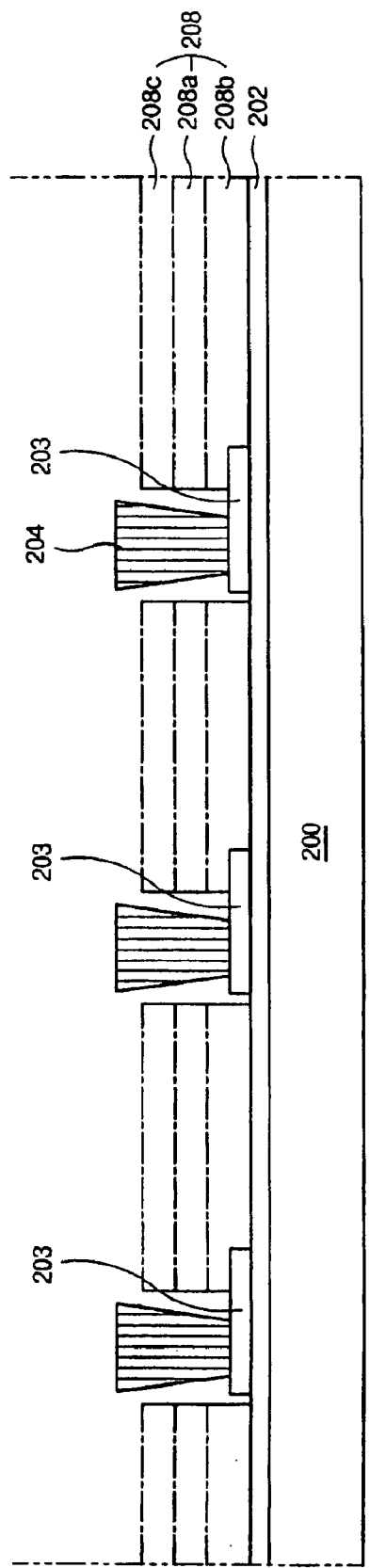
Figure 10C:
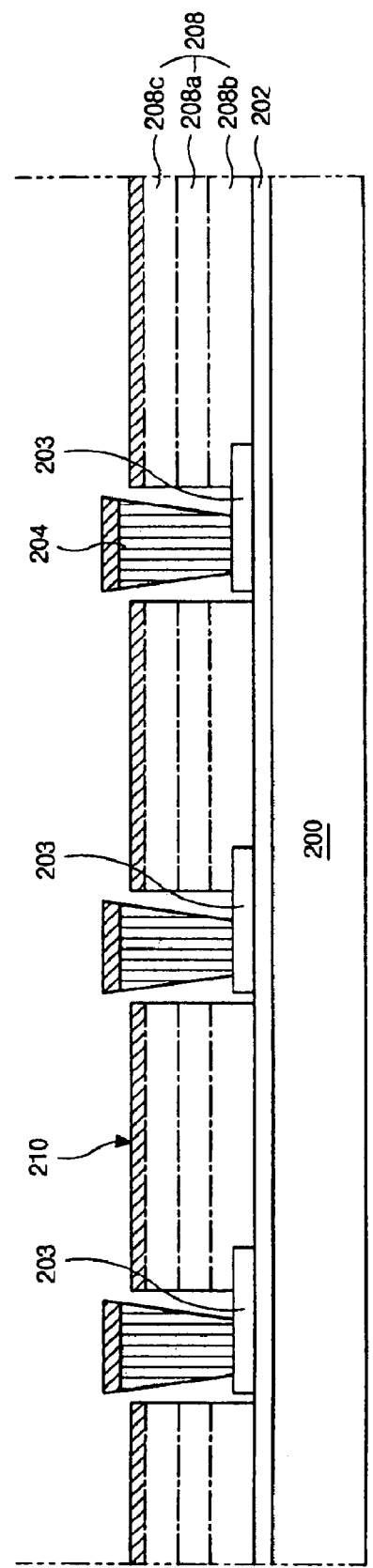

FIGS. 10A to 10C are cross sectional views of another exemplary method of fabricating an OELD device according to the present invention. In FIG. 10A, a first electrode 202 may be formed on an entire surface of a transparent second substrate 200. The first electrode 202 may be formed as a single layered structure that may include at least one of indium zinc oxide (IZO) and indium tin oxide (ITO), or may be formed as a dual layered structure that may include at least one of indium zinc oxide (IZO) and indium tin oxide (ITO), and at least one of calcium (Ca), aluminum (Al), magnesium (Mg), aluminum (Al)-lithium (Li) alloys, and magnesium (Mg)-silver (Ag) alloys. The first electrode 202 may function as an anode to supply holes into an organic light-emitting layer (not shown) and may include indium tin oxide (ITO) having a high work function.

Then, an insulating layer pattern 203 may be formed on the first electrode 202 at a position corresponding to a boundary region between neighboring pixel regions by depositing or coating inorganic insulating material(s) or organic insulating material(s) on the first electrode 202 and then patterning the deposited or coated material(s). Accordingly, the insulating layer pattern 203 may form a lattice pattern configuration, as shown in FIGS. 8 and 9, for example. In addition, the insulating layer pattern 203 may be formed to extend to the contact portions of the second electrodes 210 and the connecting electrodes 124 (in FIGS. 6 and 7C).

Next, a plurality of partitions 204 may formed on the insulating layer pattern 203, wherein the partitions 204 may also form a lattice pattern. Accordingly, the insulating layer pattern 203 may prevent the first electrode 202 from contacting the second electrodes 210 that will be formed later.

In FIG. 10B, organic light-emitting layers 208 that emit red (R), green (G), or blue (B) colored light may be formed on portions of the first electrode 202 between the partitions 204, i.e, the light-emitting layers 208 that correspond to each pixel region "P" (in FIGS. 6 and 7C). The light-emitting layers 208 may have single layered structures or multi-layered structures. Accordingly, when the light-emitting layer 208 is formed to have multi-layered structures, a hole carrying layer 208b and an electron carrying layer 208c may further be formed on bottom and top portions of a main light-emitting layer 208a.

In FIG. 10C, a plurality of second electrodes 210 may be formed on the light-emitting layers 208. Accordingly, since the partitions 204 may have trapezoidal shapes, a metal layer for forming the second electrodes 210 may not be formed on lateral sides of the partitions 204. Thus, the metal layer for forming the second electrodes 210 may be formed only on top surfaces of the partitions 204 and on portions of the light-emitting layers 208 between the partitions 204 and neighboring partitions 204, wherein the second electrodes 210 are separately formed for each pixel region "P" (in FIG. 6). The second electrodes 210 may include at least one of aluminum (Al), calcium (Ca), and magnesium (Mg), or may be formed having dual layered structures that may include metal material(s), such as lithium fluorine (LiF) and aluminum (Al). In addition, the connecting electrodes 124 (in FIG. 7C) may be formed of a same material as that of the second electrodes 210.

Finally, the OELD device may be assembled by attaching together the first substrate 100 having the TFT array part and the second substrate 200 having the light-emitting part, as shown in FIG. 6, for example.

The OELD device according to the present invention has the following advantages. First, since the OELD device functions on a top emission-type OELD device and a shape of an TFT array pattern under the light-emitting layer may not be affected by the emitting light, a high aperture ratio may be obtained. Second, since the organic light-emitting layer may not be formed on a same substrate with the TFT array pattern, the organic light-emitting layer may be formed independently without considering effects to the TSTs of the TFT array pattern, thereby increasing manufacturing yield. Third, since the partitions may have trapezoidal shapes and may be formed in a lattice pattern along a boundary line of the pixel regions, the second electrodes may be independently formed in each pixel region without using a shadow mask process. In addition, since the insulating layer pattern may be formed between the partitions and the first electrode and may extend to the contact regions of the second electrodes and the connecting electrodes, breakage of the first and second electrodes that may be caused by application of pressure to the connecting electrodes against the second electrodes may be prevented, thereby increasing production yield.

It will be apparent to those skilled in the art that various modifications and variations can be made in the electroluminescent display (ELD) device and method of fabricating an electro-luminescent display (ELD) device of the present invention without departing from the spirit or scope of the invention. Thus, it is intended that the present invention cover the modifications and variations of this invention provided they come within the scope of the appended claims and their equivalents.

What is claimed is:

1. An organic electroluminescent display (ELD) device, comprising:
    a first substrate having a plurality of pixel regions including a plurality of pixels;
    a second substrate spaced apart and facing the first substrate;
    a plurality of switching elements and a plurality of driving elements interconnected on the second substrate;
    a plurality of connecting electrodes connected to each of the driving elements;
    a first electrode formed on an inner surface of the first substrate;
    a plurality of partitions formed on the first electrode, the partitions being formed along boundaries of neighboring pixels;
    a plurality of organic light-emitting layers disposed on the first electrode;
    a plurality of second electrodes formed on the organic light-emitting layers, each of the second electrodes are independently formed in each of the pixel regions, are separated by the partitions, and are electrically connected to one of the connecting electrodes; and
    a plurality of insulating layer patterns formed between the first electrode and the partitions, the insulating layer pattern being formed along the partitions and extending to contact regions of the connecting electrodes and the second electrodes.

2. The device according to claim 1, wherein each of the partitions have a trapezoidal shape such that a first width increases from a bottom portion of the partition adjacent to the first substrate to a top portion of the partition adjacent to the second substrate.

3. The device according to claim 1, wherein the first electrode includes transparent conductive material.

4. The device according to claim 3, wherein the first electrode includes a single layered structure having at least one of indium zinc oxide (IZO) and indium tin oxide (ITO).

5. The device according to claim 3, wherein the first electrode includes a dual layered structure having at least one of indium zinc oxide (IZO) and indium tin oxide (ITO), and at least one of calcium (Ca), aluminum (Al), magnesium (Mg), aluminum (Al)-lithium (Li) alloys, and magnesium (Mg)-silver (Ag) alloys.

6. The device according to claim 1, wherein the second electrode is formed as a single layered structure having at least one of aluminum (Al), calcium (Ca), and magnesium (Mg).

7. The device according to claim 1, wherein the second electrode is formed as a dual layered structure having at least lithium fluorine (LiF) and aluminum (Al).

8. The device according to claim 1, wherein each of the organic light-emitting layers includes a hole-carrying layer adjacent to the first electrode and an electron-carrying layer adjacent to the second electrodes.

9. The device according to claim 1, wherein each of the switching elements and the driving elements include an active layer, a gate electrode, a source electrode, and a drain electrode.

10. A method of fabricating an organic electroluminescent display (ELD) device, comprising steps of:
    forming a plurality of switching elements and a plurality of driving elements interconnected on a first substrate having a plurality of pixels;
    forming a plurality of connecting electrodes interconnected to each of the driving elements;
    forming a first electrode on an inner surface of the second substrate;
    forming a plurality of partitions over the first electrode, the partitions being formed along boundaries of neighboring pixels;
    forming organic light-emitting layers on the first electrode;
    forming second electrodes on the organic light-emitting layer;
    forming an insulating layer pattern between the first electrode and the partitions, the insulating layer pattern being formed along the partitions to extend to contact regions of the connecting electrodes and the second electrodes; and
    bonding the first and second substrates together,
    wherein the connecting electrodes of the first substrate contacts the second electrodes of the second substrate.

11. The method according to claim 10, wherein each of the partitions have a trapezoidal shape such that a first width increases from a bottom portion of the partition adjacent to the second substrate to a top portion of the partition adjacent to the first.

12. The method according to claim 10, wherein the first electrode includes transparent conductive material.

13. The method according to claim 12, wherein the first electrode includes a single layered structure having at least one of indium zinc oxide (IZO) and indium tin oxide (ITO).

14. The method according to claim 12, wherein the first electrode includes a dual layered structure having at least one of indium zinc oxide (IZO) and indium tin oxide (ITO), and at least one of calcium (Ca), aluminum (Al), magnesium (Mg), aluminum (Al)-lithium (Li) alloys, and magnesium (Mg)-silver (Ag) alloys.

15. The method according to claim 10, wherein each of the second electrodes includes a single layered structure having at least one of aluminum (Al), calcium (Ca), and magnesium (Mg).

16. The method according to claim 10, wherein each of the second electrodes includes a dual layered structure having at least lithium fluorine (LiF) and aluminum (Al).

17. The method according to claim 10, wherein each of the organic light-emitting layers includes a hole-carrying layer adjacent to the first electrode and an electron-carrying layer adjacent to the second electrodes.

18. The method according to claim 10, wherein each of the switching elements and the driving elements includes an active layer, a gate electrode, a source electrode, and a drain electrode.

* * * * *